United States Patent [19]

Sassmannshausen et al.

[11] Patent Number: 5,104,768
[45] Date of Patent: Apr. 14, 1992

[54] POSITIVE PHOTORESIST COMPOSITION CONTAINING RADIATION SENSITIVE QUINONEDIAZIDE COMPOUND AND COMPLETELY ESTERIFIED POLYAMIC ACID POLYMER

[75] Inventors: Jörg Sassmannshausen, Darmstadt; Reinhard Schulz, Reinheim; Ekkehard Bartmann, Erzhausen, all of Fed. Rep. of Germany

[73] Assignee: CIBA-GEIGY Corporation, Ardsley, N.Y.

[21] Appl. No.: 430,760

[22] Filed: Nov. 2, 1989

[30] Foreign Application Priority Data

Nov. 5, 1988 [DE] Fed. Rep. of Germany ....... 3837612

[51] Int. Cl.$^5$ .................... G03F 7/023; G03F 7/40
[52] U.S. Cl. .................... 430/192; 430/165; 430/193; 430/326; 430/330; 430/905; 430/906
[58] Field of Search ........... 430/192, 17, 330, 193, 430/326, 905, 906

[56] References Cited

U.S. PATENT DOCUMENTS

| | | |
|---|---|---|
| 3,957,512 | 5/1976 | Kleeberg et al. |
| 4,093,461 | 6/1978 | Loprest et al. |
| 4,339,521 | 7/1982 | Ahne et al. |
| 4,395,482 | 7/1983 | Ahne et al. |
| 4,451,551 | 5/1984 | Kataoka ............... 430/270 |
| 4,745,045 | 5/1988 | Fredericks et al. ........ 430/192 |
| 4,880,722 | 11/1989 | Moreau et al. .......... 430/192 |

FOREIGN PATENT DOCUMENTS 0224680 6/1987 European Pat. Off.
58-160348 9/1983 Japan.

*Primary Examiner*—Charles L. Bowers, Jr.
*Assistant Examiner*—Christopher G. Young
*Attorney, Agent, or Firm*—Harry Falber

[57] ABSTRACT

The invention relates to positive working photoresists for producing relief structures of high-temperature resistant polyimide prepolymers, which photoresists can be developed in aqueous-alkaline medium and which contain, in an organic solvent, essentially at least a) one prepolymer which is convertible into a polyimide, b) one radiation-sensitive quinonediazide compound, and further optional components, said prepolymer being a completely esterified polyamic acid polymer.

2 Claims, No Drawings

POSITIVE PHOTORESIST COMPOSITION CONTAINING RADIATION SENSITIVE QUINONEDIAZIDE COMPOUND AND COMPLETELY ESTERIFIED POLYAMIC ACID POLYMER

The present invention relates to positive photoresists of the polyimide type using quinonediazide compounds as photoactive component.

The term "photoresists" is usually applied to photostructurable organic polymers which are used in photolithographic processes and related techniques such as the production of printing plates, of printed electric circuits and printed circuit boards or, in particular, for the production of integrated semiconductor components in microelectronics.

To prepare the circuit structures in the production of integrated microelectronic semiconductor components, the semiconductor substrate is coated with the photoresist. Imagewise exposure of the photoresist layer and subsequent development then produce photoresist relief structures. These relief structures are used as masks for producing the actual circuit patterns on the semiconductor substrate, for example by etching, doping, coating with metals or other semiconductor or also insulating materials. The photoresist masks are then usually removed. By means of a plurality of such process cycles, the relief structures of the microchips are formed on the substrate.

Two different types of photoresists are in principle known, namely positive and negative resists. The distinction between the two types is that the exposed areas of positive working photoresists are removed by a development process, the unexposed areas remaining as a layer on the substrate, whereas conversely the irradiated areas of negative acting photoresists remain as a relief structure. Positive photoresists have intrinsically a higher image resolution and are therefore used chiefly for the production of VLSI (very large-scale integration) circuits.

Positive photoresists of the conventional type contain, in an organic solvent, essentially at least one resin of the novolak type which is soluble in aqueous alkalies, and one photosensitive quinonediazide compound which lowers the solubility of the resin in the alkali. By irradiating the photoresist layers produced with such compositions, the solubility in alkali is increased in the exposed areas by photo-induced structural conversion of the quinonediazide into a carboxylic acid derivative, so that positive photoresist relief structures are obtained after development in aqueous-alkaline development baths.

The ever-increasing miniaturisation in semiconductor technology and microelectronics makes the most stringent demands of photoresist materials and the relief structures which are to be delineated with them.

In addition to sensitivity, resolution and contrast of the photoresist, particular importance attaches to the mechanical and chemical stability of the photoresist material and of the relief structures during the further process steps such as, in particular, development and plasma etching, as well as to the dimensional stability and resistance of the photoresist structures to elevated temperatures.

Positive photoresists based on alkali-soluble novolak resin and quinonediazide compounds, however, are not normally sufficiently stable to heat. At temperatures above 120° C., deformation of the resist structures sets in as the resist materials begin to flow, causing edge definition and contrast as well as the line and space geometries to suffer. The accuracy of the transfer of the structure to the substrate is thereby adversely affected.

Normally the photoresist relief structures obtained after exposure and development are exposed to a thermal treatment (post-bake) at temperatures well in excess of 100° C., usually in the range from 120° to 180° C. The purpose of this thermal treatment is to remove any volatile constituents still remaining in order to effect a better adhesion of the resist to the substrate, curing of the resist structures and a reduction in erosion during subsequent plasma etching. But even during plasma etching itself, high temperatures which not infrequently exceed 200° C. are produced on the substrate. Not even the use of stabilising modifiers and after treatment measures makes it possible to increase the temperature stability of photoresists based on novolak resins at temperatures above ca. 180° C.

Polyimide and polyimide-related polmers have an intrinsically pronounced resistance to heat and chemicals. Such materials withstand intact even temperatures of ca. 400° C. over a prolonged period of time. They are therefore preeminently suitable for use as layer-forming components for photoresists for the production of high-temperature resistant structures.

By photoresists of the polyimide type are meant quite generally those materials whose main layer-forming components are soluble, and in some cases photopolymerisable, polyimides or polyamic acid derivative prepolymers which can be converted into high-temperature resistant polymers of the polyimide type.

Photoresists of the polyimide type are therefore mainly used whenever these very properties are of importance and it is desired to produce high-temperature resistant photopolymer relief structures and coatings.

The photoresists of the polyimide type which are known and also mainly used in practice are negative acting. Their layer-forming components based on prepolymers which can be converted into polyimides are photocrosslinkable, and for effective photocrosslinking they contain radical-forming photoinitiators. Such photoresists are derived principally from the basic systems disclosed in German patent specifications 2 308 830 and 3 437 340. They contain polyamic acid esters which carry ethylenically unsaturated photocrosslinkable groups such as preferably allyloxy or (meth)acryloxyloxy groups, as well as photoinitiators and, in some cases, further photopolymerisable compounds, photosensitisers, dyes and modifying additives. The advantage of the high-temperature stability of photoresists of the polyimide type is offset by their limited resolution on account of their negative mode of action. There has therefore been no lack of attempts to develop positive working photoresists of the polyimide type, but always starting from polyimide prepolymers which do not contain any photopolymerisable groups or components.

Thus, for example, German Offenlegungsschrift 2 631 535 and Japanese Patent Kokai Sho 58-160 438 disclose photoresist systems which contain polyamic acids as resin components and quinonediazide compounds as photoactive components. It has been found, however, as clearly stated in European patent application 0 023 662, that such resist formulations only have a limited shelf-life, as quinonediazide compounds decompose fairly rapidly in the presence of acid. In addition, the differences in solubility between the exposed and unexposed areas of such photoresists are comparatively slight, and their stability to alkaline developer and etching solutions is insufficient.

European patent application 0 224 680 discloses improved systems of this kind in which the acid component in the polyimide prepolymer is reduced, for example, by partial imidisation, partial neutralisation with basic reagents, as well as partial esterification of the polyamic acid function or by blending with polyamic acid esters.

However, even these systems contain substantial amounts of polyamic acid, which are evidently held to be necessary, so that the problems outlined above, especially the insufficient shelf-life, are still not satisfactorily solved.

Accordingly, it is the object of the present invention to provide positive working photoresists of the polyimide type which are superior to the known systems of the prior art, especially with respect to shelf-life.

Surprisingly, it has now been found that positive working photoresists of the polyimide type which can be developed in aqueous-alkaline medium can be formulated with completely esterified polyamic acid prepolymers and radiation-sensitive quinonediazide compounds, and that such formulations have excellent storage stability.

Specifically, the invention relates to positive working photoresists for producing relief structures of high-temperature resistant polyimide prepolymers, which photoresists can be developed in aqueous-alkaline medium and which contain, in an organic solvent, essentially at least a) one prepolymer which is convertible into a polyimide, b) one radiation-sensitive quinonediazide compound, and further optional components, said prepolymer being a completely esterified polyamic acid polymer.

The invention further relates to a process for the production of relief structures of high-temperature resistant polyimide polymers by coating a substrate with a photoresist solution, drying the layer, exposing said layer imagewise by UV radiation from a wavelength in the range from ca. 250 to 450 nm, developing the exposed layer by removing the irradiated areas thereof with an aqueous-alkaline developer solution, and post-baking the relief structures so obtained, which process comprises using a positive working photoresist which contains a completely esterified polyamic acid polymer as a prepolymer which is convertable into a polyimide, and a radiation-sensitive quinonediazide compound.

The film-forming component of the positive photoresist of the polyimide type is essentially a completely esterified polyamic acid ester prepolymer which is convertible into a high-temperature resistant polyimide polymer. In principle, suitable prepolymers are, for example, all those known compounds disclosed in large number in the above cited publications. Quite generally, such prepolymers are polycondensates or polyadducts of tetrafunctional aromatic compounds which contain two functional groups capable of polycondensation or polyaddition reactions, and two completely esterified carboxyl groups adjacent thereto, with suitably reactive difunctional aromatic compounds such as aromatic diamines, diisocyanates, dicarboxylic or bis(carbonyl) chlorides. The resultant polyamic acid esterprepolymers are principally derived from mononuclear or binuclear tetracarboxylic acids and mononuclear or binuclear diamines. The suitable tetracarboxylic acids are preferably pyromellitic acids or 3,3',4,4'-benzophenonetetracarboxylic acid; the suitable diamines are preferably 4,4'-diaminodiphenyl ether, 4,4'-diaminodiphenylmethane and 4,4'-diaminophenyl sulfone. Most preferred are prepolymers based or pyromellitic acid or 3,3',4,4'-benzophenonetetracarboxylic acid and 4,4'-diaminodiphenyl ether. These prepolymers can be prepared in simple manner, for example as described in the publications cited above, by reacting equimolar amounts of the dianhydrides of the tetracarboxylic acids with the suitable diamines. If the respective two carboxylic acid radicals which, per tetracarboxylic acid unit, are not required for the polyamide bond, are subjected additionally to esterification beforehand or in the further course of the reaction, then the corresponding polyamic acid ester prepolymers are obtained. Complete esterification within the purport of this invention results when not less than 95%, preferably from 98 to 100%, of all carboxyl groups are esterified. These polyamic acid esters are mainly the esters of lower aliphatic alcohols such as methanol and ethanol. They may also be the unsaturated esters of glycol monoallylether or 2-hydroxyethyl methacrylate known from German patent specification 2 437 348. Particularly preferred layer-forming components for the positive photoresists of the polyimide type of this invention are the polyamic acid ester methacryloyloxyethyl esters obtainable from pyromellitic dianhydride or 3,3',4,4'-benzophenonetetracarboxylic dianhydride and 4,4'-diaminodiphenyl ether.

The polyamic acid ester prepolymers intended for use in the positive photoresists of the polyimide type may have molecular weights which vary within a wide range. The essential prerequisite is only that they shall be sufficiently soluble in customary solvents and, when coated, form a dry, firm layer after evaporation of the solvent. The preferred molecular weight ranges are from 5 000 to 100 000, more particularly from 10 000 to 30 000. The photoresists of this invention contain the prepolymer ordinarily in an amount of 45–95% by weight, preferably of 50–90% by weight, based on the total content of the photoresist solution.

The photosensitive quinonediazide compounds present in the photoresists of the polyimide type of this invention are esterification products of 1,2-naphthoquinone-2-diazide-5-sulfonic acid or 1,2-naphthoquinone-2-diazide-4-sulfonic acid with low molecular aromatic hydroxy compounds, especially hydroxybenzophenones such as 2,3,4-trihydroxybenzophenone and 2,3,4,4'-tetrahydroxybenzophenone, as well as trihydroxybenzenes such as 1,3,5-trihydroxybenzene. These naphthoquinonediazide compounds have broad absorption in the near to medium UV wavelength range from ca. 300 to 450 nm. Strong emission lines of the mercury lamps conventionally used in projection apparatus lie in this wavelength range, for example the lines at 313 nm, 334 nm, 365 nm, 405 nm and 436 nm. These compounds are present in the photoresist in an amount of 5–55% by weight, preferably 10–30% by weight, based on the total solids content.

The photosensitive components used in the positive photoresists of the polyimide type of this invention are preferably 1,2-naphthoquinonediazide-5-sulfonyl esters of trihydroxybenzene isomers. These esters may be the triesters of 1,2,3-, 1,2,4- and 1,3,5-trihydroxybenzene. These compounds are known and may be obtained in simple manner by esterification of the corresponding trihydroxybenzene isomers with 1,2-naphthoquinonediazide-5-sulfonyl chloride as pure complete esters. The isomeric forms of these triesters are normally used pure, but may also be used in admixture with one another. They are used in the positive photoresists of this invention preferably in an amount such that, for the photobleachable absorption (A value), an absorption coefficient of not less than 0.4 $\mu m^{-1}$ results. Preferably the A value to be adjusted is in the range from 0.50 to 0.75 $\mu m^{-1}$ at a radiation wavelength of 436 nm. This will be the case subject to the insignificantly varying molar extinction of these isomers from a concentration of ca. 15% by weight, based on the total solids content. The particularly preferred radiation-sensitive component is the 1,2-naphthoquinonediazide-5-sulfonyl triester of 1,3,5-trihydroxybenzene. This component is preferably used in a concentration of 17–30% by weight, based on the total solids content.

Suitable solvents for the preparation of the photoresist solution are in principle all solvents in which the non-volatile photoresist constituents such as prepolymer, quinonediazide compound and further optional modifiers, are sufficiently soluble, and which do not react irreversibly with these constituents. Illustrative examples of suitable solvents are aprotic polar solvents such as dimethyl formamide, dimethyl acetamide, N-methylpyrrolidone, hexamethylphosphoric triamide and butyrolactone, aliphatic ketones, such as methyl ethyl ketone, cyclopentanone or cyclohexanone, aliphatic esters such as ethyl acetate or butyl acetate, ethers such as dioxane or tetrahydrofuran, mono- or diethers as well as ether or ester derivatives of glycol compounds such as ethylene glycol monomethyl ether, ethylene glycol dimethyl ether, ethoxyethyl acetate or methoxypropyl acetate, and monooxocarboxylic acid esters such as ethyl lactate or ethyl 2-ethoxypropionate. Mixtures of the cited solvents are also often used. The photoresists of this invention preferably contain N-methylpyrrolidone and cyclopentanone as solvent. The amount of solvent will normally be 40–90% by weight, based on the total photoresist solution.

To adapt them to the requirements of the respective end use, the photoresists of this invention can be still further modified by the addition of modifying additives customarily employed in this technology and optimised, for example, in respect of spectral sensitivity, individual absorption, minimum exposure energy, attainable image resolution and edge definition, coating and development properties.

The additional customary modifying additives which may also be present in the positive photoresists of the polyimide type of this invention comprise couplers, levelling agents, plasticisers, further film-forming resins, surfactants and stabilisers. Modifiers of this kind are well known to the skilled person and described in detail in the pertinent literature. The amount of such modifiers will overall scarcely exceed 25% by weight, based on the total solids content of the photoresist solution.

The photoresists of this invention are formulated in a manner known per se by mixing or dissolving the components in the solvent or solvent mixture. Once the components have been dissolved in the solvent, the resultant photoresist solution is filtered through a membrane filter having a pore size of 0.1–1 $\mu m$, depending on the desired particle size. Normally the total solids content of the photoresist will be adjusted to the desired layer thickness and method of coating.

The principal field of use is the production of microelectronic and optoelectronic circuits and components. For this utility, these materials may act as temporary photoresist masks as well as permanent structures, for example as insulating, protective or passivating layers, dielectric layers or, in liquid crystal display elements, as orientating layers. Polyimide materials are also very suitable, for example, for protecting solid-state circuits from α-radiation.

Application is made by methods which are known per se and with the apparatus conventionally employed for the purpose by coating a substrate with the photoresist solution, drying the layer at elevated temperature, exposing said layer imagewise by radiation from a wavelength range in which the layer is sensitive, developing by dissolving out the irradiated areas of the layer, and post-baking the relief structures so obtained.

Suitable substrates are mainly semiconductor discs such as silicon wafers which may be coated with a layer of silicon dioxide, silicon nitride or aluminium. Other materials customarily used in the manufacture of miniaturised circuits are also suitable, for example germanium, gallium arsenide, and ceramics which may be coated with noble metals.

Coating is normally carried out by immersion, spraying, roller coating or spin-coating. In this last mentioned and most frequently employed coating method, the resultant layer thickness depends on the viscosity of the photoresist solution, the solids content and the rate of spin-coating. So-called spin curves are plotted for each photoresist, from which the resist layer thicknesses can be determined as a function of the viscosity and rate of spin-coating. The photoresists of this invention can be used with advantage for producing layers and relief structures with layer thicknesses of 0.1 to 500 $\mu m$. Thin layers, for example when used as temporary photoresists or as insulating layers or dielectric layers, in multilayer circuits typically have a thickness of 0.1 to 5 $\mu m$, preferably 1–2 $\mu m$. Thick layers, for example for use as passivating layers or for protecting semiconductor memory elements from α-radiation, typically have a thickness of 10 to 200 $\mu m$, preferably 20 to 100 $\mu m$.

After the photoresist has been applied to the substrate, it is normally predried in the temperature range from 50° to 120° C. Ovens or heating plates may be used for drying. The drying time in an oven is in the range from ca. 10–60 minutes, but may also be several hours for drying thick layers. On heating plates, the drying time is usually in the range from ca. 0.5–5 minutes.

The photoresist layer is then subjected to radiation. Normally actinic light is used, but it is also possible to use energy-rich radiation such as X-ray or electron beam radiation. The irradiation or exposure can be carried out through a mask, but a beam of radiation can also be directed over the surface of the photoresist layer. Normally radiation is carried out with UV lamps which emit a wavelength in the range from 250–450 nm, preferably 300–400nm. Exposure may be made polychromatically or monochromatically. It is preferred to use commercially available radiation apparatus such as contact and distance exposure apparatus, scanning projection exposure devices or wafer steppers.

After exposure, a pattern can then be developed to expose portions of the substrate by treating the layer, for example by immersion or spraying, with an aqueous-alkaline developer solution which removes the irradiated areas of the photoresist layer.

It is possible to use different developer formulations which belong either to the class of the metal ion containing or metal ion-free photoresist developers. Metal ion containing developers are aqueous solutions of sodium hydroxide or potassium hydroxide which may additionally contain pH regulating and buffering substances such as phosphates or silicates as well as surfactants and stabilisers. Metal ion-free developers contain organic bases such as tetramethylammonium hydroxide or choline in place of alkali metal compounds. The development times depend on the exposure energy, strength of the developer, the type of development, the predrying temperature and the developer temperature. Typical development times are ca. 1–3 minutes in immersion development, and ca. 10–30 seconds in spray development. The development is normally stopped by immersion in, or spraying with, a non-solvent such as isopropanol or deionised water.

The positive photoresists of the polyimide type of this invention are able to produce polymer coatings and sharply contoured relief structures having layer thicknesses from 0.1 to 500 μm, while image resolutions—depending on the layer thickness—down to as low as ca. 1 μm are possible.

By post-baking in the temperature range from ca. 200° to 400° C., the polyamic acid ester prepolymer, which forms the essential component of the photoresist layer or relief structure, is converted into the polyimide by thermal imidisation. The loss of layer thickness during post-baking is moderate to insignificant, depending on the amount of volatile components.

The positive photoresists of the polyimide type of this invention have an unexpected and exceptional storage stability, for which the absence of virtually any acid components appears to be responsible. They are stable and ready for use over a considerable period of time, without changes caused by decomposition, reactions of the components, gelation and the like being observed. They combine the high structural resolution owing to their positive mode of action with the high temperature stability of the polyimide relief structures which can thereby be produced.

The special value of the photoresists of this invention for use in practice resides in these very properties.

EXAMPLES

Photoresist Formulations

In the following Examples, unless otherwise stated, the photoresist solutions are prepared by mixing the components listed in the following Table and by subsequent microfiltration through filters having a pore size of 1 μm.

| Formulation | A | B | C |
| --- | --- | --- | --- |
| polyamic acid ester prepolymer (polycondensate of pyromellitic dianhydride, 4,4'-diaminodiphenyl ether and 2-hydroxyethyl methacrylate according to German patent 2 437 348) | 2.0 g | 4.0 g | 4.0 g |
| 1,2-naphthoquinonediazide-5-sulfonyl triester of 1,3,5-trihydroxybenzene | 2.0 g | 3.0 g | 0.4 g |
| N-methylpyrrolidone | 6.0 g | 7.0 g | 7.0 g |

Experimental Methods

The photoresist formulations are spin coated on to the oxidised surface of silicon wafers of 4 inches (100 mm) diameter, and dried on a heating plate at 100° C. Exposure is made polychromatically (apparatus: Süss MJB 55 mercury extreme pressure lamp; lamp power 4.8 mW/cm²) through a resolution test mask with structures (indentations and lines) from 1 to 100 μm in vacuum contact with additional nitrogen blanketing, the exposure energies being recorded at 365 nm with a measuring probe.

Development is carried out by the immersion or spray method with a mixture of equal parts of a 20% aqueous solution of tetramethylammonium hydroxide and isopropanol, and stopped with isopropanol or deionised water.

EXAMPLE 1

Formulation A

| | |
| --- | --- |
| coating | 200 rpm/30″ (revolutions per minute/second) |
| predrying | 2′ (minute) |
| layer thickness | 3.3 μm |
| exposure energy | 1320 mJ/cm² |
| development | immersion development/2′ |

Sharply contoured mask structures are reproduced accurately down to 2 μm.

EXAMPLE 2

Formulation A

| | |
| --- | --- |
| coating | 2000 rpm/30″ |
| predrying | 2′ |
| layer thickness | 3.3 μm |
| exposure energy | 1980 mJ/cm² |
| development | spray development/90″ |

Sharply contoured mask structures are reproduced accurately down to 2 μm.

EXAMPLE 3

Formulation B

| | |
| --- | --- |
| coating | 3000 rpm/30″ |
| predrying | 3′ |
| layer thickness | 5.7 μm |
| exposure energy | 615 mJ/cm² |
| development | immersion development/2′ |

Sharply contoured mask structures are reproduced accurately down to 1.75 μm.

After post-baking (heating for 30 minutes to 250° C./30 minutes to 250° C./30 minutes to 400° C.), the relief structures converted into polyimide have a layer thickness of 3.2 μm without loss of resolution and edge definition.

EXAMPLE 4

Formulation C

| | |
| --- | --- |
| coating | 3000 rpm/30″ |
| predrying | 2′ |
| layer thickness | 3.5 μm |
| exposure energy | 263 mJ/cm² |
| development | immersion development/7′ |

Sharply contoured mask structures are reproduced accurately down to 1.75 μm.

What is claimed is:

1. A positive working photoresist for producing relief structures of high-temperature resistant polyimide, which photoresist can be developed in an aqueous-alkaline medium comprising a) an organic solvent,
b) a completely esterified polyamic acid polymer which is convertible into a polyimide, and
c) one radiation sensitive quinonediazide compound.

2. A photoresist composition according to claim 1, which contains 45-95% by weight of completely esterified polyamic acid polymer and 55-5% by weight of quinonediazide compound, based on the total solids content.

* * * * *